(12) United States Patent
Hirai et al.

(10) Patent No.: US 7,355,879 B2
(45) Date of Patent: Apr. 8, 2008

(54) SEMICONDUCTOR INTEGRATED CIRCUIT, OPERATING METHOD THEREOF, AND IC CARD INCLUDING THE CIRCUIT

(75) Inventors: Tadahiko Hirai, Ohta-ku (JP); Kikuzo Sawada, Koganei (JP)

(73) Assignee: Canon Kabushiki Kaisha, Tokyo (JP)

( * ) Notice: Subject to any disclaimer, the term of this patent is extended or adjusted under 35 U.S.C. 154(b) by 92 days.

(21) Appl. No.: 10/555,964

(22) PCT Filed: Dec. 7, 2004

(86) PCT No.: PCT/JP2004/018545

§ 371 (c)(1),
(2), (4) Date: Nov. 8, 2005

(87) PCT Pub. No.: WO2005/060002

PCT Pub. Date: Jun. 30, 2005

(65) Prior Publication Data

US 2006/0262589 A1    Nov. 23, 2006

(30) Foreign Application Priority Data

Dec. 18, 2003  (JP) .............................. 2003-420261

(51) Int. Cl.
*G11C 11/00* (2006.01)
(52) U.S. Cl. ...................... 365/148; 365/129; 365/163; 257/40
(58) Field of Classification Search ................. 365/148
See application file for complete search history.

(56) References Cited

U.S. PATENT DOCUMENTS

| | | | |
|---|---|---|---|
| 6,034,882 A | 3/2000 | Johnson et al. | 365/103 |
| 6,185,122 B1 | 2/2001 | Johnson et al. | 365/103 |
| 6,614,682 B2* | 9/2003 | Hirai | 365/173 |
| 6,707,704 B2* | 3/2004 | Kato et al. | 365/145 |
| 6,724,651 B2* | 4/2004 | Hirai | 365/158 |
| 6,807,080 B2* | 10/2004 | Rickes et al. | 365/145 |
| 2005/0211977 A1 | 9/2005 | Hirai et al. | 257/40 |
| 2006/0092685 A1* | 5/2006 | Ootsuka et al. | 365/145 |

FOREIGN PATENT DOCUMENTS

| | | |
|---|---|---|
| JP | 7-176703 | 7/1995 |
| JP | 10-209388 | 8/1998 |
| JP | 2000-349250 | 12/2000 |
| JP | 2002-530850 | 9/2002 |
| WO | WO 00/30118 | 5/2000 |
| WO | WO 01/73845 A1 | 10/2001 |

* cited by examiner

*Primary Examiner*—Son L. Mai
(74) *Attorney, Agent, or Firm*—Fitzpatrick, Cella, Harper & Scinto

(57) ABSTRACT

One main electrode of a TFT is connected with one terminal of a two-terminal type nonvolatile memory element, a gate electrode of the TFT is connected with a word line, and the other main electrode thereof is connected with a bit line. The other terminal of the memory element is connected with a base line. A fixed resistor is connected between a connecting point between the other main electrode of the TFT and the bit line and an input terminal of the bit line. In information writing for changing the memory element whose initial state is a low impedance state to a high impedance state, voltages having polarities reverse relative to a reference voltage are applied to the input terminal of the bit line and an input terminal of the base line, respectively, so that a high voltage necessary to change the state is applied between both the terminals of the memory element.

4 Claims, 4 Drawing Sheets

FIG. 3A  Vg
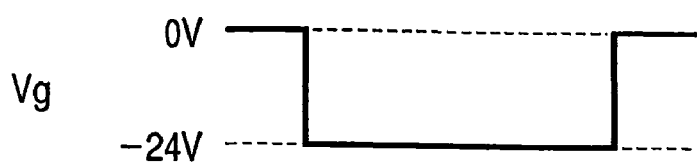
FIG. 3B  Va
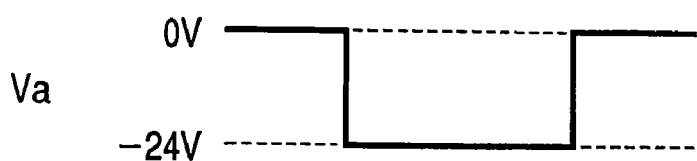
FIG. 3C  Vb
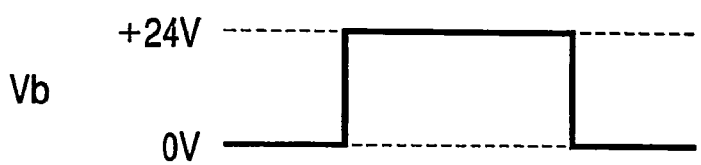
FIG. 3D  Vg
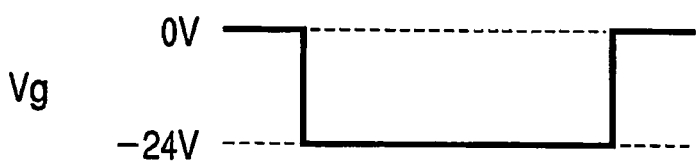
FIG. 3E  Va
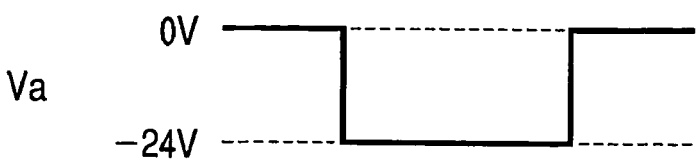
FIG. 3F  Vb
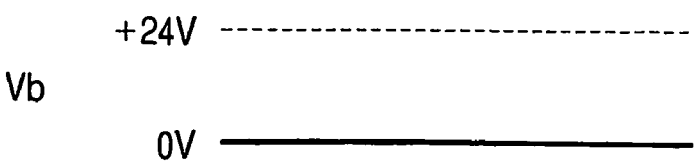

SEMICONDUCTOR INTEGRATED CIRCUIT, OPERATING METHOD THEREOF, AND IC CARD INCLUDING THE CIRCUIT

TECHNICAL FIELD

The present invention relates to a semiconductor integrated circuit which is a nonvolatile memory in which information is retained even after a power source is turned off, an operating method thereof, and an IC card including the semiconductor integrated circuit.

BACKGROUND ART

In a semiconductor field, up to now, a system constructed using single crystalline silicon has been general. In recent years, development of elements and circuits using non-crystalline silicon such as amorphous silicon or polycrystalline silicon or a non-silicon semiconductor such as an organic semiconductor, diamond, or silicon carbide has been progressing rapidly.

However, the single crystalline silicon constituting an element has a superior characteristic. Therefore, the large majority of semiconductor integrated circuits which are actually used are fundamentally made of a single crystalline silicon. Circuits each using a semiconductor other than the single crystalline silicon have not been studied sufficiently up to now.

A semiconductor memory which is a principal constituent circuit of a computer has not been also studied. In particular, in a nonvolatile memory in which information is retained even after a power source is turned off, a single crystalline silicon transistor is used as a transistor for controlling an applied voltage to a memory element (Japanese Patent Application Laid-Open No. 2002-530850).

DISCLOSURE OF THE INVENTION

In general, the single crystalline silicon transistor is manufactured by using a single crystalline silicon substrate (wafer) and it is hard to form the transistor in a substrate other than the single crystalline silicon substrate. On the other hand, it is possible to form a transistor using the non-crystalline silicon or the non-silicon semiconductor in the substrate other than the single crystalline silicon substrate, such as a glass substrate or a resin substrate. Therefore, if a circuit can be constructed by using the semiconductor other than the single crystalline silicon, there is a wide choice of substrates. Thus, it is expected to rapidly expand applications of the circuit.

However, when a circuit is constructed by using a transistor made of the semiconductor other than the single crystalline silicon, which has not been studied up to now, in particular, a thin film transistor, in the above-mentioned nonvolatile memory, there is a problem in that a sufficient voltage cannot be applied to a memory element at a time when information is written into the memory element because the transistor has a high on-resistance.

An object of the present invention is to provide a semiconductor integrated circuit which can preferably operate even when a transistor having a high on-resistance other than the single crystalline silicon transistor is used for the nonvolatile memory and an operating method thereof, and further to provide an IC card using the semiconductor integrated circuit.

According to a first aspect of the present invention, there is provided a semiconductor integrated circuit including:

a plurality of memory cells, each of which includes a field effect transistor having a gate electrode, two main electrodes, and a semiconductor layer and a two-terminal type nonvolatile memory element, in which one of the main electrodes of the transistor is connected with one terminal of the nonvolatile memory element, the other main electrodes are connected with a bit line, the gate electrode is connected with a word line, and the other terminal of the memory element is connected with a base line;

means for detecting a potential on a connecting portion between the bit line and the other main electrodes of the transistor; and means capable of supplying voltages having polarities reverse relative to a reference voltage to an input terminal of the bit line and an input terminal of the base line, respectively.

In further aspect of the semiconductor integrated circuit, it is preferable that:

the field effect transistor does not contain single crystalline silicon;

the field effect transistor is a thin film transistor;

the field effect transistor is made of non-crystalline silicon or an organic semiconductor;

the nonvolatile memory element shows a high impedance state and a low impedance state; and the nonvolatile memory element is made of a material containing organic matter.

According to a second aspect of the present invention, there is provided a method of operating a semiconductor integrated circuit including a plurality of memory cells, each of which includes a field effect transistor having a gate electrode, two main electrodes, and a semiconductor layer and a two-terminal type nonvolatile memory element, in which one of the main electrodes of the transistor is connected with one terminal of the nonvolatile memory element, the other main electrodes are connected with a bit line, the gate electrode is connected with a word line, and the other terminal of the memory element is connected with a base line; and means for detecting a potential on a connecting portion between the bit line and the other main electrodes of the transistor, the method including:

supplying voltages having polarities reverse relative to a reference voltage to an input terminal of the bit line and an input terminal of the base line, respectively to apply a predetermined voltage between both the terminals of the memory element.

In further aspect of the method of operating a semiconductor integrated circuit, it is preferable that:

a predetermined voltage is applied between both the terminals of the memory element to write information in the memory element by supplying the voltages having the polarities reverse relative to the reference voltage to the input terminal of the bit line and the input terminal of the base line, respectively;

the nonvolatile memory element is a rewritable memory element, and a predetermined voltage is applied between both the terminals of the memory element to write information therein by supplying the voltages having the polarities reverse relative to the reference voltage to the input terminal of the bit line and the input terminal of the base line, respectively; and a predetermined voltage having a polarity reverse to that at writing is applied between both the terminals of the memory element to erase the information written in the memory element by supplying voltages having polarities reverse to those at the writing to the input terminal of the bit line and the input terminal of the base line, respectively.

According to a third aspect of the present invention, there is provided an IC card including the above semiconductor integrated circuit.

According to the present invention, it is possible to use a transistor made of a semiconductor other than the single crystalline silicon. Therefore, the nonvolatile memory can be provided at lower cost by mass production by using the transistor.

The transistor made of the semiconductor other than the single crystalline silicon can be formed on the substrate other than the single crystalline silicon substrate, such as a glass substrate, a plastic substrate, or a paper, so that applications rapidly expand. In particular, the semiconductor integrated circuit of the present invention is preferably applied to an IC card. Therefore, it is also possible to construct a flexible IC card by using, for example, a flexible substrate. In addition, the IC card is writable and rewritable, with the result that historical information of products can be inputted for control with time by application to, for example, a tag for product control.

BRIEF DESCRIPTION OF THE DRAWINGS

FIGS. 3A, 3B, 3C, 3D, 3E, and 3F are timing charts at the time of operation of the memory cell shown in FIG. 1.

BEST MODES FOR CARRYING OUT THE INVENTION

Figure 1:
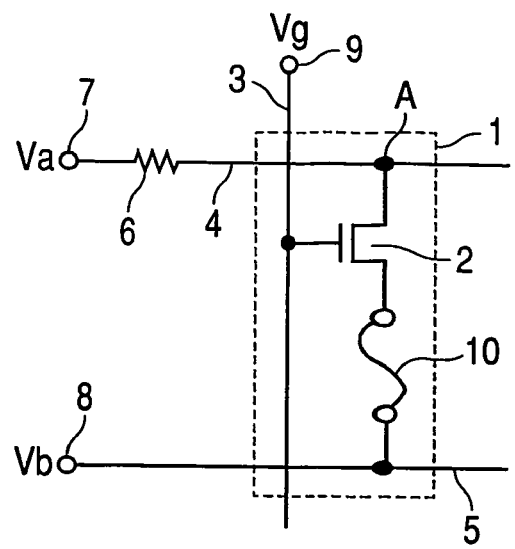
FIG. 1 is an equivalent circuit diagram showing a memory cell of a semiconductor integrated circuit according to an embodiment of the present invention.

A semiconductor integrated circuit of the present invention is a nonvolatile memory which is characterized by including a plurality of memory cells, each of which has a field effect transistor (FET) and a two-terminal type memory element, and the circuit is characterized in that a sufficiently high voltage is applied by supplying voltages having polarities reverse to each other between both terminals of the memory cell at a time when a predetermined voltage is applied between both the terminals.

The FET used in the present invention has a gate electrode, two main electrodes, and a semiconductor layer. Any of single crystalline silicon, polycrystalline silicon, non-crystalline silicon such as amorphous silicon, and a non-silicon organic semiconductor can be used for the semiconductor layer. It is also possible to use a thin film transistor (TFT). Any of the non-crystalline silicon and the organic semiconductor is preferably used for a semiconductor layer of the TFT. Any type of a p-channel type and an n-channel type can be used.

A nonvolatile memory element used in the present invention is preferably a memory cell which can retain temporarily written information for a long period after a power source is turned off and preferably has two states which are a high impedance state and a low impedance state. In such a memory element, for example, "1" and "0" are assigned to the two states, respectively, so that the memory element can be operated as the nonvolatile memory element.

The nonvolatile memory element has an irreversible type in which temporarily written information cannot be rewritten and a reversible type (rewritable) in which temporarily written information can be rewritten. The former includes a fuse type and an anti-fuse type and the latter includes a rewritable type element containing organic matter. In particular, the present invention is characterized in that voltages having polarities reverse to each other are applied between both terminals of the memory element at a time when any information of "0" and "1" is written in information write operation. In the case where the memory element is of the reversible type, voltages having polarities reverse to each other are applied between both the terminals of the memory element at a time when any information of "0" and "1" is written in information write operation. In rewrite, voltages having polarities reverse to each other and reverse to the polarities of the voltages at the time of writing are applied between both the terminals of the memory element to erase information temporarily written into the memory element and then new information writing is performed.

An electrical conductor containing organic matter, such as polydiacetylene, TCNQ (tetracyanoquinodimethane), or PEDOT (polyethylenedioxythiophene) is preferably used for the fuse type element of the nonvolatile memory elements according to the present invention. A conductor containing metal as a main component, such as gold, aluminum, silver, copper, lead, or indium may be used.

A structure in which a dielectric material is sandwiched by electrodes each made of a conductor is preferably used for the anti-fuse type element of the nonvolatile memory elements according to the present invention. A material containing metal or organic matter may be used for the electrodes. A material containing a metallic oxide or organic matter may be used as the dielectric material. In particular, a material containing aluminum oxide, tantalum oxide, silicon oxide, a polyimide resin, or an epoxy resin is preferably used.

A structure containing a metallic oxide or organic matter, in particular, a structure containing copper TCNQ and an aluminum oxide film, a structure in which an aluminum thin film is sandwiched by organic conductors, or the like is preferably used for the rewritable type element of the nonvolatile memory elements according to the present invention.

FIG. 1 shows an equivalent circuit of a memory cell of a semiconductor integrated circuit according to a preferred embodiment of the present invention. This embodiment is an embodiment in which a circuit is composed of a p-channel TFT and a fuse type nonvolatile memory element. The p-channel TFT becomes an on state when a negative voltage relative to a voltage between two main electrodes (one is a source and the other is a drain) is applied to a gate electrode. In this embodiment, when a gate voltage is −24 V, the p-channel TFT becomes a complete on state. The fuse type nonvolatile memory element in this embodiment is an element using an organic conductor of PEDOT, which is a memory element having a characteristic similar to that of a fuse in which an initial state is the low impedance state and it is irreversibly changed to the high impedance state by applying the predetermined voltage between the two terminals.

In FIG. 1, reference numeral 1 denotes a memory cell; 2, a TFT; 3, a word line; 4, a bit line; 5, a base line; 6, a fixed resister; 7 to 9, input terminals; and 10, a memory element.

In the memory cell 1 serving as a fundamental unit of the semiconductor integrated circuit of the present invention, a gate electrode of the TFT2 is connected with the word line 3, one main electrode thereof is connected with one terminal of the memory element 10, and the other main electrode thereof is connected with the bit line 4. The other terminal of the memory element 10 is connected with the base line 5. The fixed resistor 6 is connected between a connecting point A between the bit line 4 and the other main electrode of the TFT 2 and the input terminal 7 of the bit line 4. The circuit includes means for supplying voltages having polarities reverse to each other relative to a reference voltage to the input terminal 7 of the bit line 4 and the input terminal 8 of the base line 5.

Figure 2:
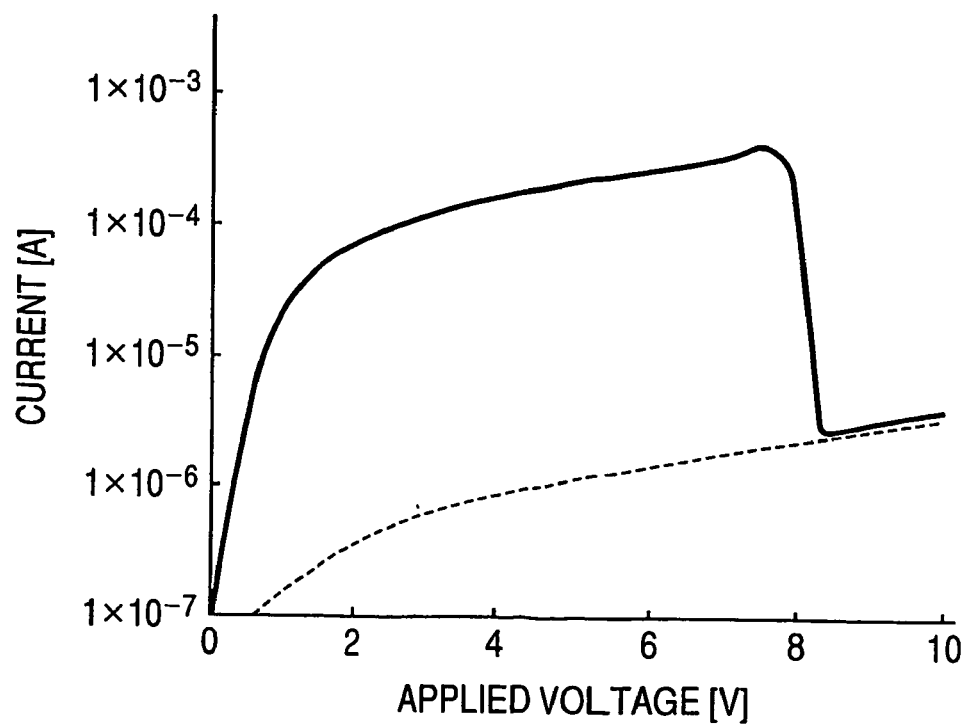
FIG. 2 is a graph showing an electrical characteristic of a memory element used in the present invention.

FIG. 2 shows an electrical characteristic of the memory element 10 used in this embodiment. In FIG. 2, the abscissa indicates a voltage applied between both the terminals of the memory element 10 and the ordinate indicates a current flowing between both the terminals. The initial state of the memory element 10 is the low impedance state. When the voltage applied between both the terminals of the memory element 10 which is in the initial state gradually rises, as indicated by a solid line in the figure, a current flowing into the memory element 10 gradually increases and a current value significantly reduces in the vicinity of 8 V. That is, the low impedance state is changed to the high impedance state in the vicinity of 8 V serving as a threshold value. With this state, the applied voltage temporarily returns to 0 and gradually rises again. Then, as indicated by a broken line in the figure, although the current value gradually rises with an increase in applied voltage, the high impedance state is obtained as compared with the case of voltage application in the initial state (solid line). After that, such an electrical characteristic is maintained. That is, the memory element 10 acts as the irreversible type nonvolatile memory element similar to a fuse.

In the memory element 10, one of the high impedance state and the low impedance state is set to "0" and the other is set to "1". Only in the case of information corresponding to the low impedance state, a high voltage of 8 V or more is applied, so that predetermined information can be written.

FIGS. 3A to 3F are timing charts in information write and readout operations of the circuit shown in FIG. 1. In FIGS. 3A to 3F, FIGS. 3A to 3C show the write operation and FIGS. 3D to 3F show the readout operation. FIGS. 3A and 3D each show a voltage Vg applied from the input terminal 9 to the word line 3. FIGS. 3B and 3E each show a voltage Va applied from the input terminal 7 to the bit line 4. FIGS. 3C and 3F each show a voltage Vb applied from the input terminal 8 to the base line 5. In this embodiment, the reference voltage is set to 0.

In the write operation, a voltage of −24 V is applied to the word line 3, so that the TFT 2 becomes an on state. Next, −24 V is applied from the input terminal 7 to the bit line 4 and a voltage of +24 V is applied from the input terminal 8 to the base line 5. Then, a potential difference of 48 V is caused between the input terminal 7 of the bit line 4 and the base line 5. When the fixed resistor 6 and the TFT 2 which have predetermined resistance values are selected, a potential difference of 12 to 15 V is caused between both the terminals of the memory element 10 by voltage drop based on those resistance values. As a result, the low impedance state which is the initial state of the memory element 10 is charged to the high impedance state, so that information is written.

The application of the high voltage to the memory element 10 is required only in the case where information corresponding to the high impedance state is written. When information to be written in the memory element 10 corresponds to the low impedance state, the voltage applied to the memory element 10 is set to a low value in which the low impedance state is not changed to the high impedance state.

Next, in the readout operation, a voltage of −24 V is applied to the word line 3 to allow the TFT 2 to be in an on state. Then, −24 V is applied from the input terminal 7 to the bit line 4. In contrast to the time of writing, the base line 5 is maintained to be 0 V (grounded). Therefore, a potential difference of 24 V is caused between the input terminal 7 of the bit line 4 and the base line 5, with the result that a current flows therebetween. A potential on the connecting point A between the bit line 4 and the other main electrode of the TFT 2 is changed according to the information stored in the memory element 10, that is, according to whether the memory element 10 is in the high impedance state or the low impedance state. Thus, the information stored in the memory element 10 can be read out by detecting the potential on the connecting point A.

In the above-mentioned circuit structure, the resistance value of the fixed resistor 6 is set according to an impedance value of the memory element 10 and an on-resistance of the TFT 2 so that a sufficiently high voltage is applied to only the memory element 10 which is intended to change to the high impedance state in the write operation and a low voltage in which the memory element 10 is not changed from the low impedance state to the high impedance state is applied thereto in the readout operation. The fixed resistor 6 can be used instead of a member having a predetermined resistance, such as a transistor, a wiring, or a wiring contact.

In the readout operation, a current may be supplied from a constant current source to the bit line 4. In this case, the fixed resistor 6 can be omitted.

Means for detecting the potential on the connecting point A is not particularly limited. For example, a sense amplifier (comparator) is preferably used.

Figure 4:
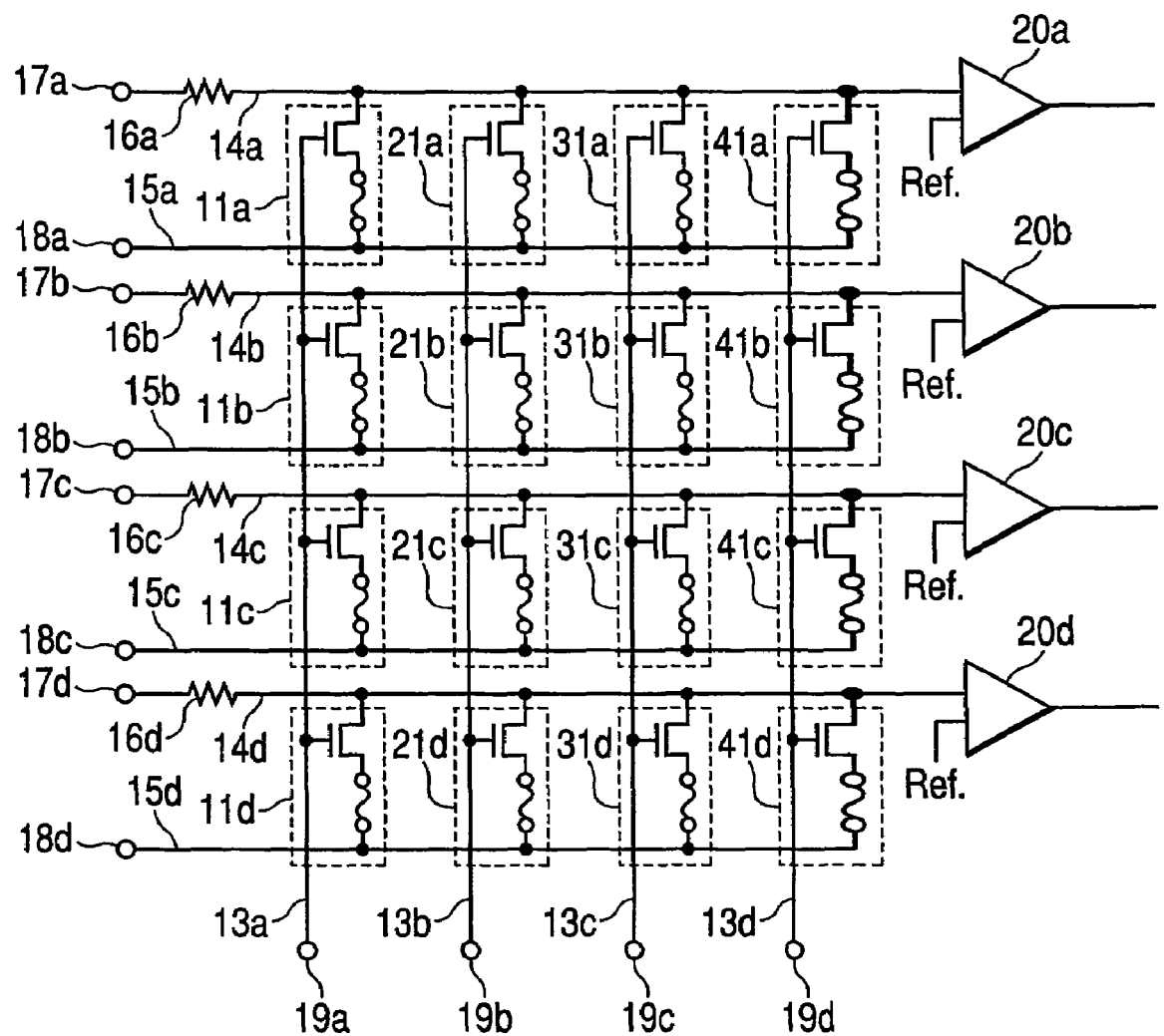
FIG. 4 is an equivalent circuit diagram showing the semiconductor integrated circuit according to the embodiment of the present invention.

FIG. 4 shows an equivalent circuit of the semiconductor integrated circuit according to the embodiment of the present invention using the memory cell shown in FIG. 1. In the figure, reference numerals 11a to 11d, 21a to 21d, 31a to 31d, and 41a to 41d denote memory cells; 13a to 13d, word lines; 14a to 14d, bit lines; 15a to 15d, base lines; 16a to 16d, fixed resistors; 17a to 17d, 18a to 18d, and 19a to 19d, input terminals; and 20a to 20d, sense amplifies.

In this embodiment, the memory cells, each of which has the structure shown in FIG. 1, are arranged in 4 rows and 4 columns. The gate electrodes of transistors of memory cells in the same row are connected with a common word line. The other main electrodes of transistors of memory cells in the same column are connected with a common bit line. The other terminals of the memory cells are connected with a common base line. All the memory cells are wired in matrix by the word lines 13a to 13d, the bit lines 14a to 14d, and the base lines 15a to 15d.

In this embodiment, in the write operation, first, the word line 13a is selected and −24 V is applied from the input terminal 19a, so that all TFTs of the memory cells 11a to 11d connected with the word line 13a become an on state. Next, in order that a potential difference between the bit line and the base line may become 48 V with respect to, of the memory cells 11a to 11d, only a memory cell whose memory element is intended to change to the high impedance state, −24 V is applied to the bit line and +24 V is applied to the base line. More specifically, −24 V is applied to the bit line connected with the memory cell which is intended to change to the high impedance state and +24 V is applied to the base line connected therewith. The bit line and the base line which are connected with a memory cell whose memory element is intended to maintain in the low impedance state are maintained to be 0 V. Alternatively, the predetermined voltage is commonly applied to one of a group including the bit lines 14a to 14d and a group including the base lines 15a to 15d. A predetermined voltage is applied to only the other group including the lines connected with the memory cell which is intended to change to the high impedance state. Therefore, the memory element of the corresponding memory cell is changed to the high impedance state.

The above-mentioned operation is repeated for each of the word lines 13b to 13d, so that information is written in parallel in the plurality memory cells for each row.

In the readout operation of information from the integrated circuit shown in FIG. 4, as in the write operation, the word line 13a is selected to allow the TFT to be in an on state, with the result that −24 V is applied to all the bit lines 14a to 14d. All the base lines 15a to 15d are set to 0 V (grounded). Then, different potentials changed according to impedances of the memory elements of the respective memory cells 11a to 11d are inputted to sense amplifiers 20a to 20d. When −12 V serving as a reference potential (Ref.) is inputted to each of the sense amplifiers 20a to 20d and the reference potential is compared with the inputted potential from the bit line 14a, voltages corresponding to information stored in the respective memory cells 11a and 11d are outputted from the sense amplifiers 20a to 20d.

The above-mentioned operation is repeated for each of the word lines 13b to 13d, so that information stored in the plurality of memory cells is readout in parallel for each row.

In this embodiment, the memory cells are arranged in 4 rows and 4 columns and wired in matrix by the word lines, the bit lines, and the base lines to write and read out information in parallel for each row. However, the present invention is not limited to this. The number of rows and the number of columns can be freely selected. It is also possible to write and read out information in series. In this embodiment, the sense amplifier is provided for each of the bit lines 14a to 14d. However, the present invention is not limited to this. Information may be read out in series using a single sense amplifier.

Figure 5:
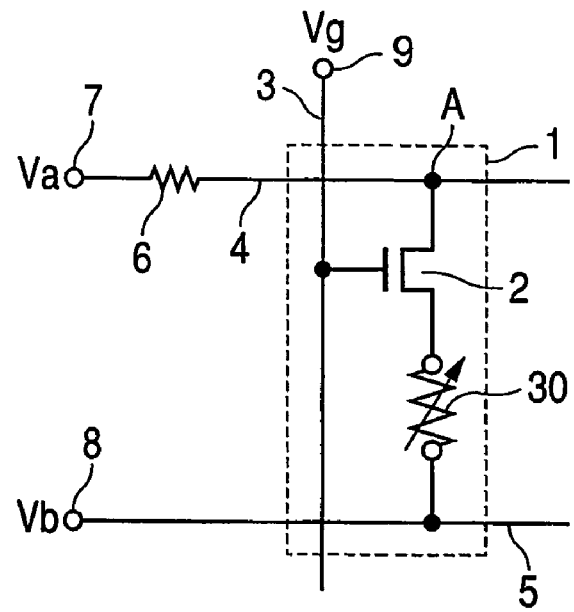
FIG. 5 is an equivalent circuit diagram showing a memory cell of a semiconductor integrated circuit according to another embodiment of the present invention.

Next, the operation in the case where the reversible type memory cell is used will be described. FIG. 5 shows an equivalent circuit of a memory cell of a semiconductor integrated circuit according to the present invention, which is constructed by using a nonvolatile memory element in which a coevaporation film made of copper and TCNQ and an extremely thin aluminum oxide film are stacked. In the figure, reference numeral 30 denotes a memory element and the same references are provided for the same members as those shown in FIG. 1.

In the structure shown in FIG. 5, an electrical characteristic from the initial state is identical to that of the memory cell having the structure shown in FIG. 1. As shown in FIG. 2, the initial state is the low impedance state. This state is changed to the high impedance state by the application of the voltage of about 8 V and then maintained. As in the structure shown in FIG. 1, −24 V is applied to the bit line 4 and +24 V is applied to the base line 5. Therefore, a high voltage of 8 V or more can be applied to the memory element 30 to change it to the high impedance state. When −24 V is applied to the bit line 4, the base line 5 is set to 0 V (grounded), and a potential on the connecting point A is detected, information stored in the memory element 30 can be read out.

In the structure shown in FIG. 5, the information in the memory element can be rewritten. More Specifically, a high voltage (that is, −8 V or less) having a polarity reverse to that at a time when the memory element 30 is changed to the high impedance state is applied to the memory element 30. Therefore, the information temporarily stored in the memory element 30 is erased and the memory element 30 is returned to the initial state.

Figure 6A:
FIGS. 6A, 6B and 6C are timing charts at the time of erase operation of the memory cell shown in FIG. 5.
Figure 6B:
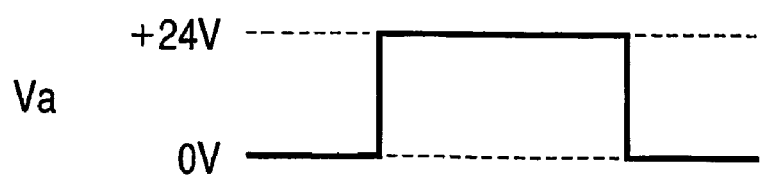
Figure 6C:
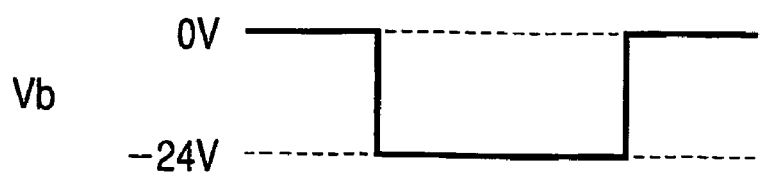

FIGS. 6A to 6C are timing charts at the time of erase operation. FIG. 6A shows the voltage Vg applied from the input terminal 9 of the word line 3. FIG. 6B shows the voltage Va applied from the input terminal 7 of the bit line 4. FIG. 6C shows the voltage Vb applied from the input terminal 8 of the base line 5.

As shown in FIGS. 6A to 6C, −24 V is applied to the word line 3 to allow the TFT 2 to be in an on state. Then, +24 V having a polarity reverse to that at the time of information writing is applied to the bit line 4 and −24 V having a polarity reverse to that at the time of information writing is applied to the base line 5. Therefore, −12 to −15 V having a polarity reverse to that at the time of information writing is applied between both the terminals of the memory element 30, so that the high impedance state is changed to the low impedance state for initialization. New information can be written in the initialized memory element 30 at the timing shown in FIGS. 3A to 3F.

When the structure shown in FIGS. 6A to 6C is applied to the matrix wiring as shown in FIG. 4, information can be written, read out, and erased in parallel for each row. The number of rows and the number of columns can be freely selected in a like manner. Information may be also written, read out, and erased in series. Efficient rewriting can be performed by simultaneously erasing on all the memory cells.

According to the present invention, the IC card can be constructed by using the semiconductor integrated circuit. In the IC card construction, the transistor made of a semiconductor other than single crystalline silicon can be used for the semiconductor integrated circuit. Thus, the substrate such as the glass substrate, the plastic substrate, or the paper can be used according to its application.

This application claims priority from Japanese Patent Application No. 2003-420261 filed on Dec. 18, 2003, which is hereby incorporated by reference herein.

The invention claimed is:

1. A semiconductor integrated circuit comprising: a plurality of memory cells, each of which comprises a field effect transistor having a semiconductor layer bearing a gate electrode and two main electrodes, and having a two-terminal type nonvolatile memory element, wherein one of the main electrodes of the transistor is connected with one terminal of the nonvolatile memory element, the other main electrode is connected with a bit line, the gate electrode is connected with a word line, and the other terminal of the memory element is connected with a base line;

means for detecting a potential on a connecting portion between the bit line and the other main electrode of the transistor; and means capable of supplying voltages having reverse polarities relative to a reference voltage to an input terminal of the bit line and an input terminal of the base line, respectively, wherein the semiconductor layer of the field effect transistor comprises non-crystalline silicon.

2. A semiconductor integrated circuit comprising:

a plurality of memory cells, each of which comprises a field effect transistor having a semiconductor layer bearing a gate electrode and two main electrodes, and having a two-terminal type nonvolatile memory element, wherein one of the main electrodes of the transistor is connected with one terminal of the nonvolatile memory element, the other main electrode is connected with a bit line, the gate electrode is connected with a word line, and the other terminal of the memory element is connected with a base line;

means for detecting a potential on a connecting portion between the bit line and the other main electrode of the transistor; and means capable of supplying voltages having reverse polarities relative to a reference voltage to an input terminal of the bit line and an input terminal of the base line, respectively, wherein the semiconductor layer of the field effect transistor comprises an organic semiconductor.

3. A semiconductor integrated circuit, comprising:

a plurality of memory cells, each of which comprises a field effect transistor having a semiconductor layer bearing a gate electrode and two main electrodes, and having a two-terminal type nonvolatile memory element, wherein one of the main electrodes of the transistor is connected with one terminal of the nonvolatile memory element, the other main electrode is connected with a bit line, the gate electrode is connected with a word line, and the other terminal of the memory element is connected with a base line;

means for detecting a potential on a connecting portion between the bit line and the other main electrode of the transistor; and means capable of supplying voltages having reverse polarities relative to a reference voltage to an input terminal of the bit line and an input terminal of the base line, respectively, wherein the nonvolatile memory element comprises a material containing an organic matter.

4. A method of operating a semiconductor integrated circuit, comprising a plurality of memory cells, each of which comprises a field effect transistor having a semiconductor layer bearing a gate electrode and two main electrodes, and having a two-terminal type nonvolatile memory element, wherein one of the main electrodes of the transistor is connected with one terminal of the nonvolatile memory element, the other main electrodes is connected with a bit line, the gate electrode is connected with a word line, and the other terminal of the memory element is connected with a base line; and means for detecting a potential on a connecting portion between the bit line and the other main electrodes of the transistor, the method comprising:

supplying voltages having reverse polarities relative to a reference voltage to an input terminal of the bit line and an input terminal of the base line, respectively, to apply a predetermined voltage between both terminals of the memory element, wherein the nonvolatile memory element comprises a rewritable memory element, and a predetermined voltage is applied between both terminals of the memory element to write information therein by supplying the voltages having reverse polarities relative to the reference voltage to the input terminal of the bit line and the input terminal of the base line, respectively; and a predetermined voltage having a polarity reverse to that of a writing voltage is applied between both the terminals of the memory element to erase the information written in the memory element.

* * * * *

UNITED STATES PATENT AND TRADEMARK OFFICE
CERTIFICATE OF CORRECTION

PATENT NO. : 7,355,879 B2  Page 1 of 1
APPLICATION NO. : 10/555964
DATED : April 8, 2008
INVENTOR(S) : Tadahiko Hirai et al.

It is certified that error appears in the above-identified patent and that said Letters Patent is hereby corrected as shown below:

COLUMN 6:

Line 45, "amplifies." should read --amplifiers.--.

COLUMN 7:

Line 27, "cells 11a and 11d" should read --cells 11a to 11d--; and
Line 31, "readout" should read --read out--.

COLUMN 10:

Line 10, "electrodes" should read --electrode--.

Signed and Sealed this

Sixteenth Day of September, 2008

JON W. DUDAS
*Director of the United States Patent and Trademark Office*